United States Patent [19]

Kablanian et al.

[11] Patent Number: 5,764,878
[45] Date of Patent: Jun. 9, 1998

[54] BUILT-IN SELF REPAIR SYSTEM FOR EMBEDDED MEMORIES

[75] Inventors: Adam Kablanian, San Jose; Thomas P. Anderson, Sunnyvale; Chuong T. Le, San Jose; Owen S. Bair, Saratoga; Saravana Soundararajan, Sunnyvale, all of Calif.

[73] Assignee: LSI Logic Corporation, Milpitas, Calif.

[21] Appl. No.: 597,964

[22] Filed: Feb. 7, 1996

[51] Int. Cl.⁶ .................................. G06F 11/34
[52] U.S. Cl. .................. 395/182.05; 395/182.04; 371/10.3
[58] Field of Search ............. 371/10.3, 10.2; 3954/182.05, 182.04; 365/200, 201

[56] References Cited

U.S. PATENT DOCUMENTS

| | | | |
|---|---|---|---|
| 5,267,205 | 11/1993 | Hamada | 365/200 |
| 5,337,277 | 8/1994 | Jang | 365/200 |
| 5,377,146 | 12/1994 | Reddy et al. | 365/200 |
| 5,487,040 | 1/1996 | Sukegawa et al. | 365/200 |
| 5,577,050 | 11/1996 | Bair et al. | 371/10.2 |

*Primary Examiner*—Phung M. Chung
*Attorney, Agent, or Firm*—Fenwick & West LLP

[57] ABSTRACT

A built-in self-repair system includes an on-chip clock generator for triggering the repairing process to repair defective memory lines or blocks in a memory array of an ASIC chip. The on-chip clock generator enables the self-repair process to start at the power up of a computer system without a need for an external test-triggering signal. The system includes a built-in self-test circuit that tests for a defective row memory line or a defective I/O memory block. The system further includes a fault-latching-and repair-execution circuit that repairs a row memory line or an I/O memory block. Repairing an IO memory block effectively repairs faults that occur between any two adjacent column shorts within an IO memory block. The preferred repairing scheme adopts a 15N diagnosis to achieve high fault correction so that a large percentage of defective memory cells can be replaced by redundant row memory lines or redundant I/O memory blocks. The defective row memory lines and I/O memory blocks are dynamically repaired as each of the row memory lines and I/O memory blocks undergoes testing to determine if any defective memory cells exist.

13 Claims, 12 Drawing Sheets

BUILT-IN SELF REPAIR SYSTEM FOR EMBEDDED MEMORIES

RELATED APPLICATION

The subject matter of this application is related to the subject matter of co-pending U.S. application entitled "Method for Repairing an ASIC Memory with Redundancy Row and Input/Output Lines," Ser. No. 08/598,155 filed on Feb. 7, 1996, which is incorporated herein by reference.

FIELD OF THE INVENTION

The present invention related to the field of application specific integrated circuit (ASIC) memories, and more particularly, to systems of performing built-in self-repair for embedded memories.

BACKGROUND OF THE INVENTION

In the semiconductor industry, ASIC memories have gained enormous popularity in integrated circuits (ICs) designs. ASICs allow custom or semicustom design of ICs in shorter turn-around time while reducing the total component count and manufacturing costs. ASICs employ libraries of "standard cells" as building blocks to construct the desired logic circuits. Standard cells include commonly used programmable logic arrays, decoders, registers, counters, and other conventional circuits or components.

An ASIC chip contains single or multiple configurable memory arrays with row memory lines intersecting column memory lines. A plurality of column lines can be grouped together to form an I/O (input/output) memory block. In such instance, the memory array contains row memory lines intersecting I/O memory blocks. Each intersecting point between a row memory line and an I/O memory block represents one memory cell which stores a binary digit of logic "0" or "1". The collection of these memory cells forms a memory array which serves as a principle building block for implementing a custom or semicustom ASIC chip.

One pitfall of ASIC designs arises when memory cells fail to retain the correct data caused, for example, by the degradation of the cell structure, external abridging defects, or other reasons. Degradation of a cell structure can occur from extended use of the memory cell. External abridging defects can occur during the semiconductor fabrication process from undesirable particles that settle onto a semiconductor layer. A single memory cell failure can cause the entire ASIC chip to malfunction, and render the chip unusable. The defective ASIC chip that contains a defective memory cell must be repaired or replaced to ensure proper functioning of the ASIC chip.

Another difficulty arises from packing higher-density building blocks into a ASIC chip. Large memory blocks contain a multitude of row memory lines intersecting I/O memory blocks. As a memory array increases in size, the number of correctly functioning memory arrays decreases proportionally, caused by the increasing likelihood of locating memory cell defects within the larger memory array. In order to produce such large ASIC memories while maintaining cost control, some methodology of redundancy is desirable in order to maintain the entire memory array in correctly functioning state.

A conventional solution provides repairing schemes that encompass a number of separately performed processes, each of which requires specific equipment that is external to the ASIC memory chip. The first of these processes is testing. Automatic Test Equipment (ATE) is used to test at least one memory array on an ASIC chip. A series of test signal patterns is applied through the ATE to detect the locations of memory failures based upon responsive outputs which are then recorded in the ATE. The next process is one of analysis. External software is used to determine optimal utilization of the redundant memory lines to repair defective memory lines. The third process is the repair process. Fuse and/or antifuse equipment facilitates severing circuit fuses that are formed on the chip for selective removal through convention laser beam techniques to repair a defective memory cell. The final process involves retesting the chip using the ATE to ensure that the chip functions properly after being repaired. The repaired chip is then packaged and sent to the customer.

Such techniques for repairing ASIC chips commonly burdens a manufacturer to repair defective chips returned from users. In order to repair a defective chip, a manufacturer usually performs two tests in sequence. The first test is performed before repair, and the second test is performed after repair. This process of repairing is time-consuming and costly to a manufacturer. In addition, such repair techniques are performed external to a chip, and the chip may be mis-handled between and during each process, causing additional defects in the chip. Finally, since repairs are performed at a manufacturer's site, parts that become defective after use are generally discarded even if a repair is possible.

Although ASIC vendors strive to produce chips which are not prone to memory defects, as a practical matter, memory defects do occur for various reasons. Such causes can happen during the manufacturing process, such as when random particles of dust settle on the surface of a memory cell during processing. As the density of ASIC memories continue to increases, the likelihood of memory defects also increases at a somewhat linear rate. As a result, defective ASIC chips slow down manufacturing lines and add extra costs of using ASIC chips.

Accordingly, it is desirable to provide a system for implementing on-chip repairing schemes for circuit chips with redundancy included in the memory array.

SUMMARY OF THE INVENTION

The present invention overcomes the foregoing problems by providing a built-in self-repair system for embedded memories. The repairing system resides on a chip to allow repairing of defective memories without the need to use external machines. The repairing system is triggered automatically at power up of a computer system from an on-chip clock generator. The on-chip clock generator transmits a triggering signal to the repairing system to detect defective memory cells in a memory array. A defective row memory line is dynamically repaired as the defective row memory line is detected in a memory array. Similarly, defective I/O memory block is dynamically repaired as the defective I/O memory block is detected.

At power up of a computer system, the on-chip generator transmits two output signals. The first such output signal generated is a single pulse that initializes a fault-latching-and-repair-execution (FLARE) circuit. The second output signal generated is a repair clock signal which continues to cycle for the duration of the repair and retest operations.

FLARE receives inputs from a built-in self-test (BIST) circuit that verifies the integrity of row memory lines and I/O memory blocks in a memory array within an ASIC chip. Each of the row memory lines is treated as one unit where BIST circuit provides test results on the total number of defective memory cells detected for a single row memory line. An I/O memory block comprises at least one column memory line, but typically includes a plurality of column memory lines grouped together to form an I/O memory block. Each of the I/Os is treated as one unit, where BIST circuit provides test results on the total number of defective memory cells detected for a particular I/O memory block. The BIST circuit provides test results to the FLARE circuit which uses the received test results for repairing analysis. FLARE analyzes the defect information and performs repairs of defective row memory lines or I/O memory blocks according to a dynamic repair scheme.

The dynamic repair scheme performs repairs on the defective row memory lines or I/O memory blocks as soon as it is determined that mandatory repair of a defective memory line is necessary. Two types of mandatory repairs are performed, including a mandatory-row repair to replace a defective row memory line and a mandatory-I/O repair to replace a defective I/O memory block. These two mandatory schemes are applied simultaneously to an ASIC memory for each BIST pass. If the mandatory-row repair is invoked, the address locations of defective row memory lines reroute to new address locations associated with redundant row memory lines. Similarly, if the mandatory-I/O repair applies, the address locations of defective I/O blocks reroute to new address locations associated with redundant I/O memory blocks. In situations where both repairs are required, the method includes a specific dominant fault mechanism that prefers one mandatory repair scheme over another. For example, the mandatory-row repair may be designed as the dominant fault mechanism over the mandatory-I/O repair. In such situation where both mandatory repairs are concurrently applicable, the mandatory-row repair is first executed in favor of the mandatory-I/O repair.

Upon completion of the repair phase, a retest of the memory is performed to ensure that the redundant memory line, which replaced the defect memory line, is not itself defective. After the retest phase, the ASIC chip transmits an output signal to indicate that the memory array tested either passed or failed the test.

DETAILED DESCRIPTION OF THE PREFERRED EMBODIMENT

Figure 1:
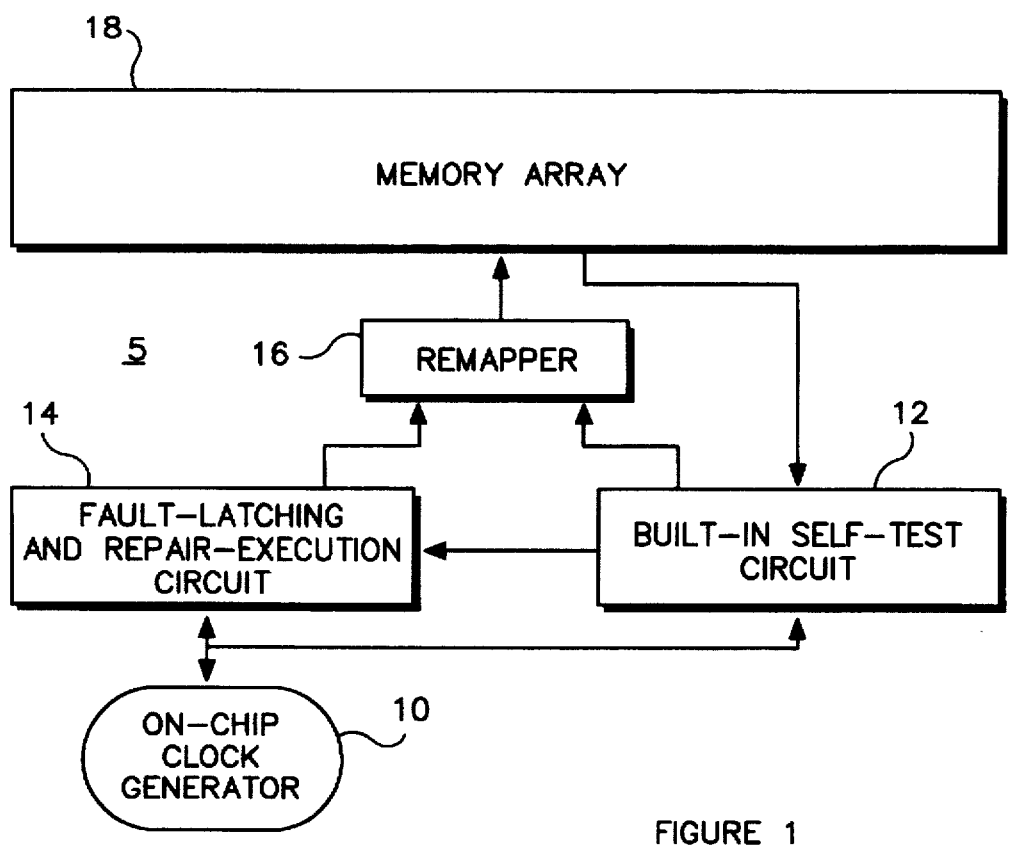
FIG. 1 is a block diagram of the built-in self-repair system for embedded memories of the present invention.

Referring now to FIG. 1, there is shown a block diagram of the built-in self-repair system 5 for embedded memories in accordance with the present invention. The system 5 includes an on-chip clock generator 10, a built-in self-test (BIST) circuit 12, a fault-latching-and-repair-execution (FLARE) circuit 14, a remapper 16, and a memory array 18. The on-chip clock generator 10 initiates the built-in self-repair system at power up by generating and applying a triggering signal to BIST 12. BIST circuit 12 tests the memory cells in the memory array 18 to locate any defective memory cells which fail to retain data correctly. FLARE circuit 14 performs repair on a row memory line if a mandatory-row is required, or performs repair on an I/O memory block if a mandatory-I/O is required. Remapper 16 redirects original address locations of defective memory accesses the address locations which can retain valid data. Memory array 18 contains a plurality of row memory lines coupled to redundant row memory lines, intersecting a plurality of I/O memory blocks coupled to redundant I/O memory blocks.

Figure 2:
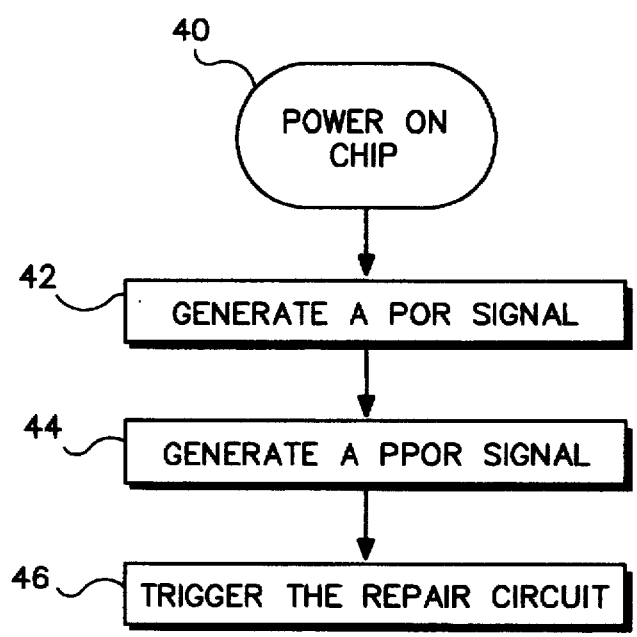
FIG. 2 is a flowgraph of the process of initiating the on-chip clock generator to trigger the FLARE circuit.

Referring now to FIG. 2, there is shown a process of the on-chip clock generation. During the power-up 40 of an associated computer system of conventional design (not shown), the computer system triggers a power-on reset (POR) circuit 50 (shown in FIG. 3) when voltage reaches a sufficiently high level to drive the logic operations in on-chip clock generator 10. POR circuit 50 generates 42 a power-on reset (POR) signal with a low-to-high output edge. The POR signal, in turn, triggers a pulse-power-on-reset circuit 60 (shown in FIG. 4) to generate 44 a pulse-power-on-reset (PPOR) signal with a high-to-low-to-high edge. The PPOR signal provides the necessary signal to trigger a FLARE reset signal in the FLARE circuit 14 to start the test and repair process.

Figure 3:
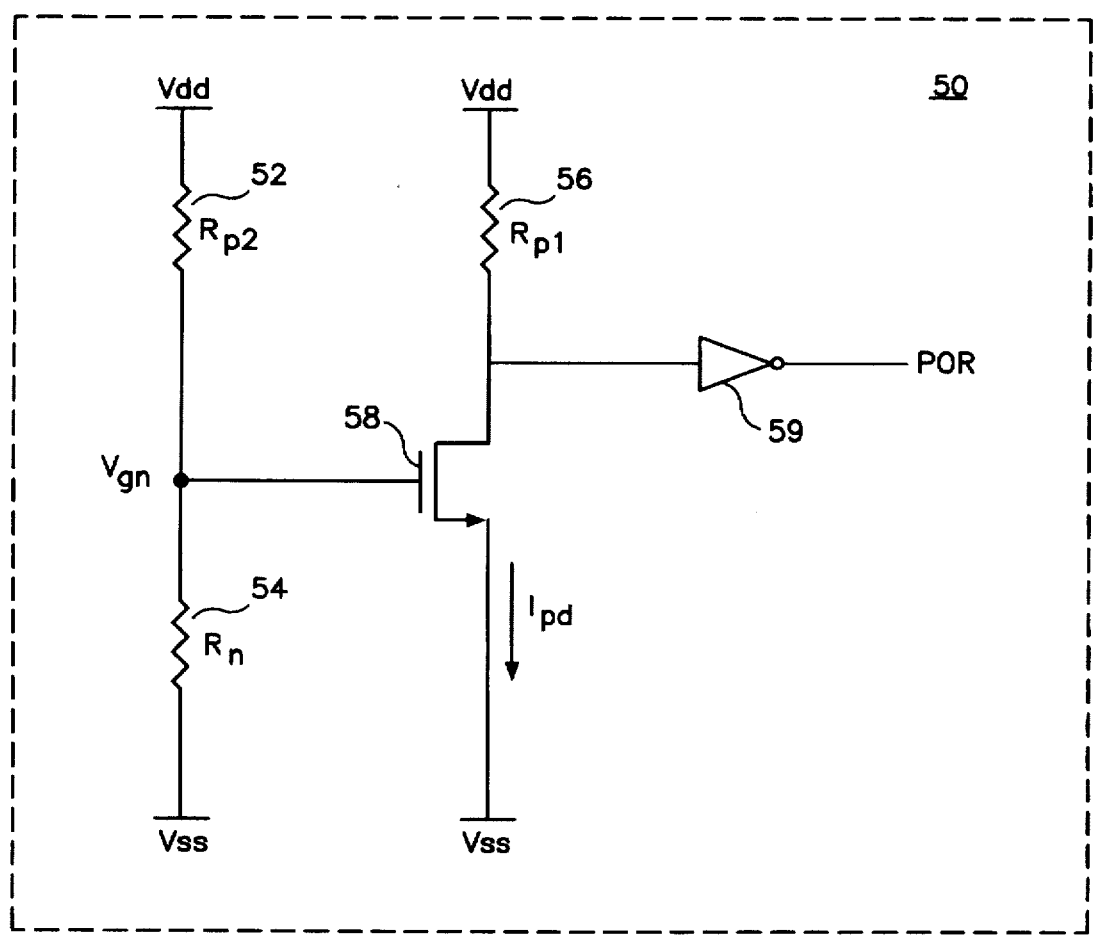
FIG. 3 is a schematic diagram of a power-on-reset (POR) circuit that resides in the on-chip clock generator.

In FIG. 3, there is shown a schematic diagram of the POR circuit 50, which comprises a resister Rn 54, a resister Rp2 52, a resistor Rp1 56, a transistor 58, and an inverter 59. Resister Rn 54 may include a plurality of NMOS devices connected in series. Resister Rp1 56 may contain a plurality of PMOS devices connected in series. A singular PMOS device may operate as resister Rp2 52, and a singular NMOS device operates as transistor 58. The voltage at a node Vgn equates to Vdd*Rn/(Rn+Rp2). The voltage at transistor 58 causes a current Ipd to flow through resistor Rp1 56, and the voltage at node Vout equals to Vdd−(Ipd*Rp1).

Figure 4:
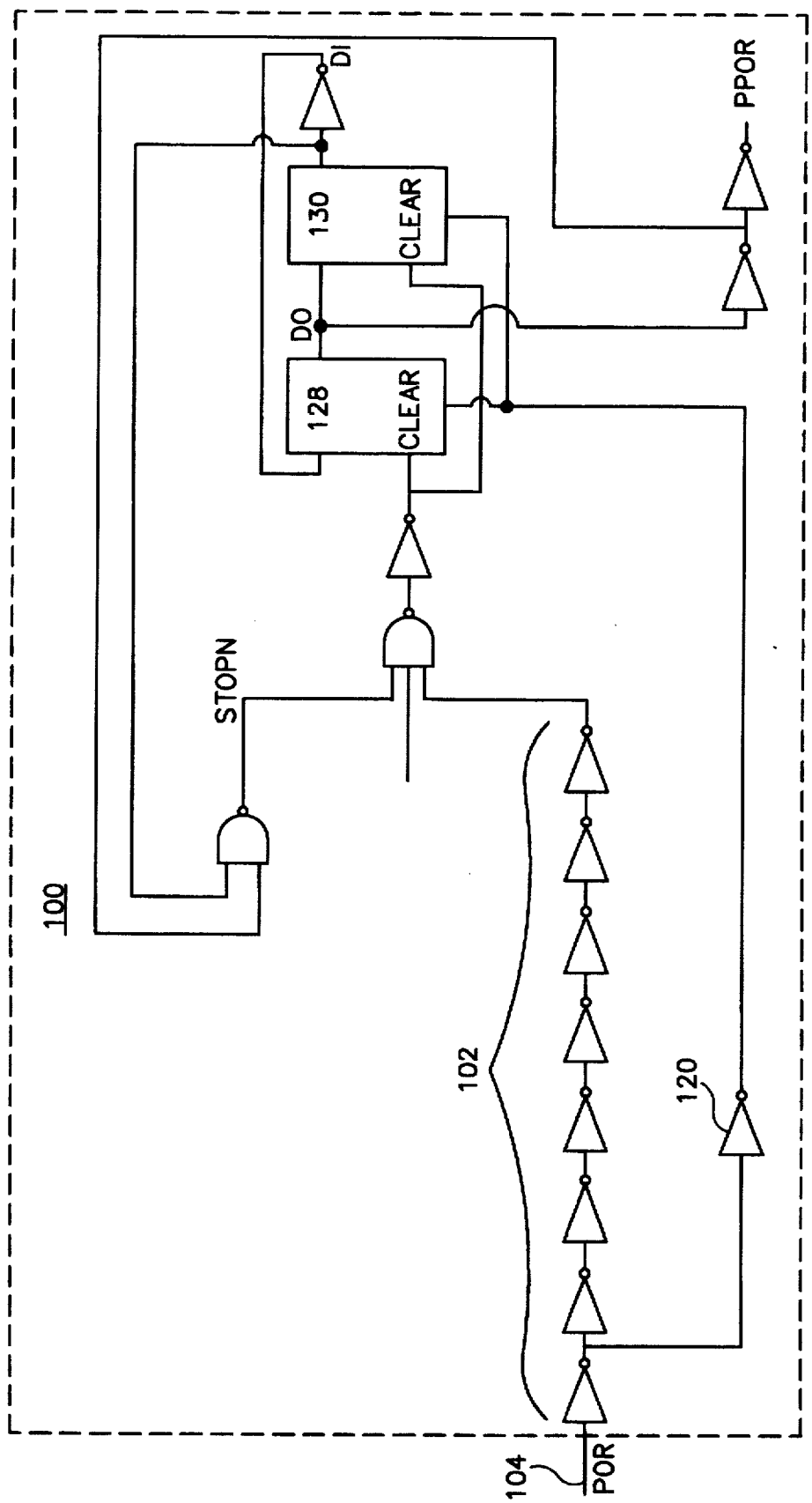
FIG. 4 is a schematic diagram of a pulse-power-on-reset (PPOR) circuit that resides in the on-chip clock generator.

FIG. 4 is a schematic diagram of a PPOR circuit 100. PPOR circuit 100 comprises a set of flip-flops 128 and 130. PPOR circuit 100 receives an input signal POR 104 which propagates through a series of inverters 102 to trigger the clear input ports of flip-flops 128 and 130. The clear input ports ensure that flip-flops 128 and 130 are initialized to a correct binary state specifically with the output of flip-flop 128 and 130 forming a logic value of "0" when POR has a logic value of "0". The first clock of flip-flops 128 and 130 occurs when POR signal 104 asserts to a logic "1", at which time the clear input ports disable and generate a positive clock edge. When PPOR signal 104 changes to a logic "1" state, PPOR signal 104 enables a clock generator circuit to trigger the clock signal of FLARE 14 which continues to clock flip-flops 128 and 130 until D0=0 and D1=1, at which point STOPN=0 to disable flip-flops 128 and 130 from any subsequent clocking.

Figure 5:
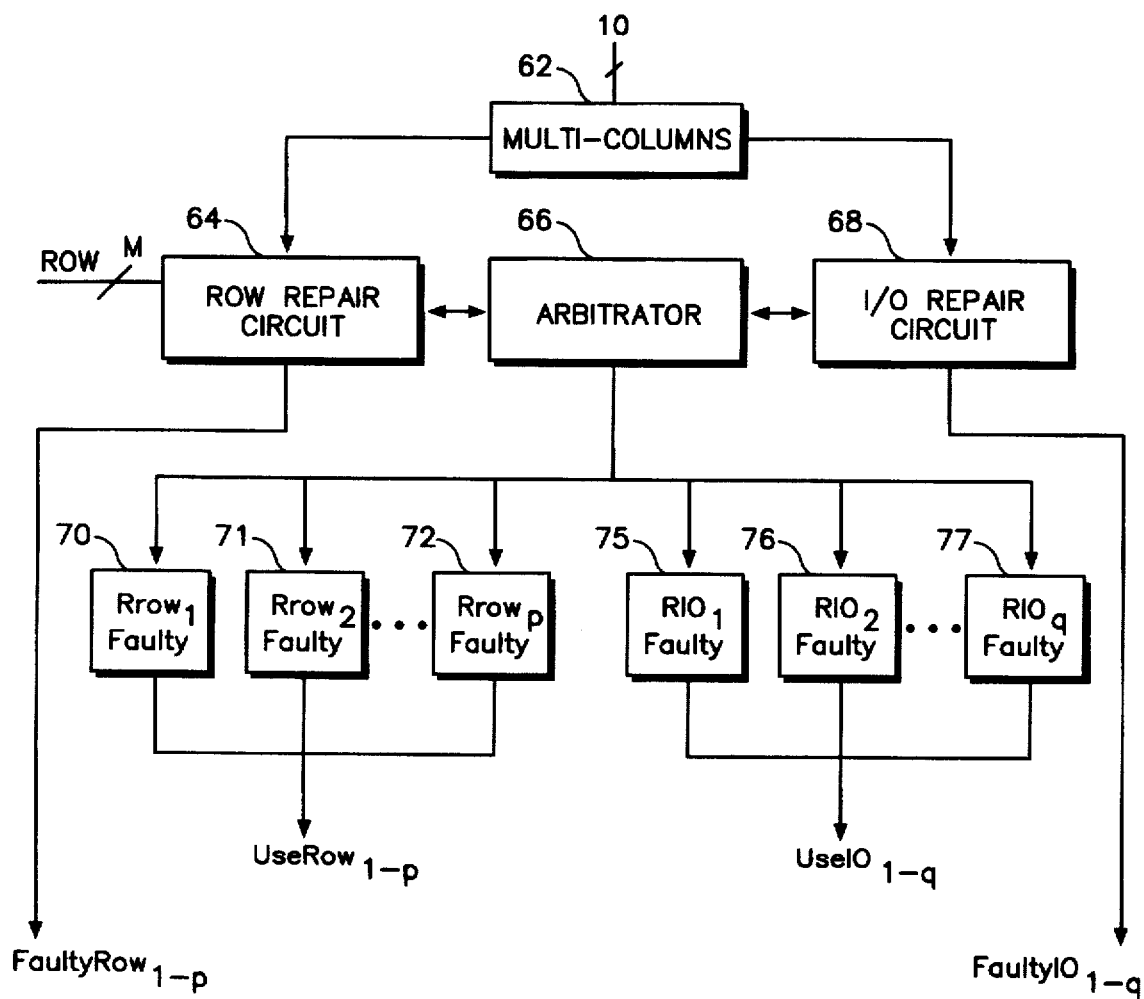
FIG. 5 is a block diagram of the illustrated embodiment of the FLARE circuit in accordance with the present invention.

FIG. 5 is a block diagram of the preferred embodiment of FLARE 14 circuit. FLARE 14 circuit contains a row-repair circuit 64, an I/O-repair circuit 68, an arbitrator 66, multi-columns circuit 62, a plurality of faulty rows 70, 71, and 72, and a plurality of faulty I/Os 75, 76, and 77. Row-repair circuit 64 determines whether it is necessary to repair a row memory line, and if it is necessary, the row-repair circuit 64 generates outputs of FaultyRow1, FaultyRow2, to identify the locations of the corresponding faulty row memory lines. Similarly, the I/O-repair circuit 68 determines whether it is necessary to repair an I/O memory line, and if it is necessary, the I/O-repair circuit 68 generates outputs of FaultyaI01, FaultyI02, to identify the locations of the corresponding faulty I/O memory lines. The arbitrator 66 dictates a selected priority preference to execute a mandatory-row repair scheme before a mandatory-I/O repair, or to execute a mandatory-I/O repair scheme before a mandatory-row repair.

The multi-columns circuit 62 selects the targeted column within an I/O for FLARE circuit 14 to analyze the validity of the memory cells in a particular column. If each of the plurality of the FaultyRow 70, 71, and 72 is faulty, the corresponding UseRow signal enables to indicate that the redundant row has become active due to the memory failures at that row memory line, in which the redundant row memory line replaces the defective row memory line. Similarly, if each of the plurality of the FaultyIO 75, 76, and 77 is faulty, the corresponding UseIO signal indicates that the detected I/O has become inactive due to the memory failures at that I/O memory block, and the redundant I/O is activated. It should be noted that FLARE circuit 14 may be implemented using conventional hardware circuits, or by using a hardware language such as VHDL. One scheme for implementing FLARE circuit 14 is disclosed in co-pending U.S. patent application Ser. No. 08/598,155 entitled "Method for Repairing an ASIC Memory with Redundancy Row and Input/Output Lines."

Figure 6:
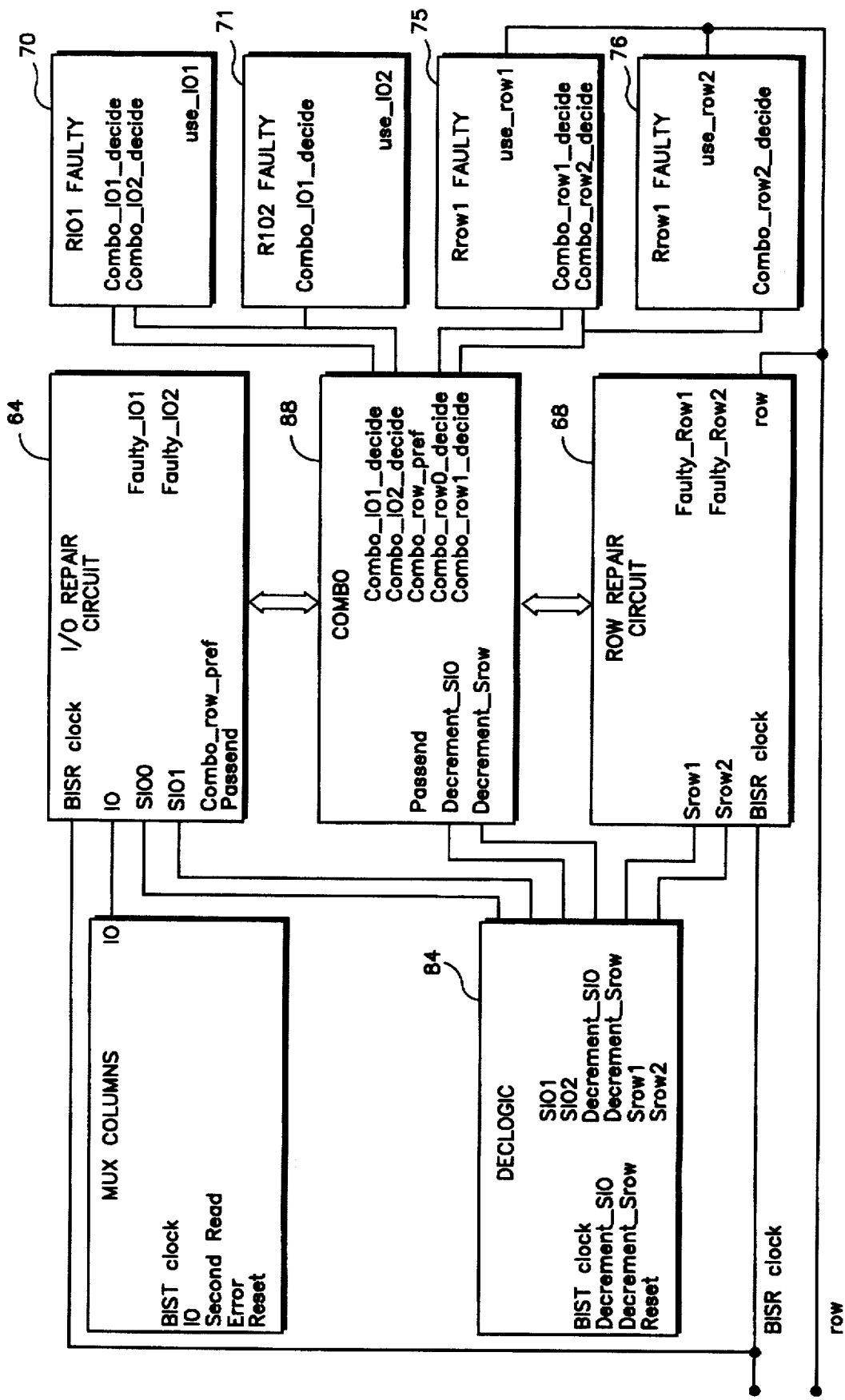
FIG. 6 is a block diagram of an alternative embodiment of the FLARE circuit, implemented with two redundant rows and I/Os.

Referring now to FIG. 6, there is shown an alternate embodiment of FLARE 14 circuit implemented with two redundant rows and I/Os. FLARE circuit 14 in this embodiment includes a mux-columns circuit 80, a decoder logic 84, an I/O-repair circuit 64, a row-repair circuit 68, a combo circuit 88, RIO1Faulty circuits 70 and 71, and Rrow faulty circuits 75 and 76. A BISR clock signal triggers 10-repair circuit 64 and row-repair circuit 68. FLARE circuit 14 in FIG. 5 contains a plurality of input signals and a plurality of output signals. The input signals to FLARE circuit 14 include the following incoming signals: BISRclock, BISTclock, IO, Passend, SecondRead, Error, Reset, and row. The BIST signal triggers Mux Columns 80 and Declogic 84. If the IO signal contains a value of zero, there is a bit error at that bit location. A Passend signal denotes the end of a BIST pass. The SecondRead signal represents the second read operation of BIST. The error signal indicates an error at that address location if the error signal contains a value of zero. The reset signal resets logic states of FLARE circuit 14 to its initialized state. A row signal indicates the number of bits in a row memory line.

The output signals to FLARE circuit 14 include: Faulty_IO1, Use_IO1, Faulty_IO2, Use_IO2, Faulty_Row1, Use-Row1, Faulty_Row2, and Use_Row2. The Faulty_IO1 denotes the address location of the first IO memory block. The Use_IO1 enables to indicate that the first redundant IO memory block is in use. In addition, the Faulty_IO2 denotes the address location of the second redundant IO memory block. The Use_IO2 enables to indicate that a second redundant IO memory block is in use. Similarly, the Faulty_Row1 represents the address location of the first redundant row memory line. The Use_Row1 signal is asserted to indicate the first redundant row memory line is in use. In addition, the Faulty_Row2 represents the address location of the second redundant row memory line. The Use_Row2 signal is asserted to indicate the first redundant row memory line is in use.

Figure 7A:
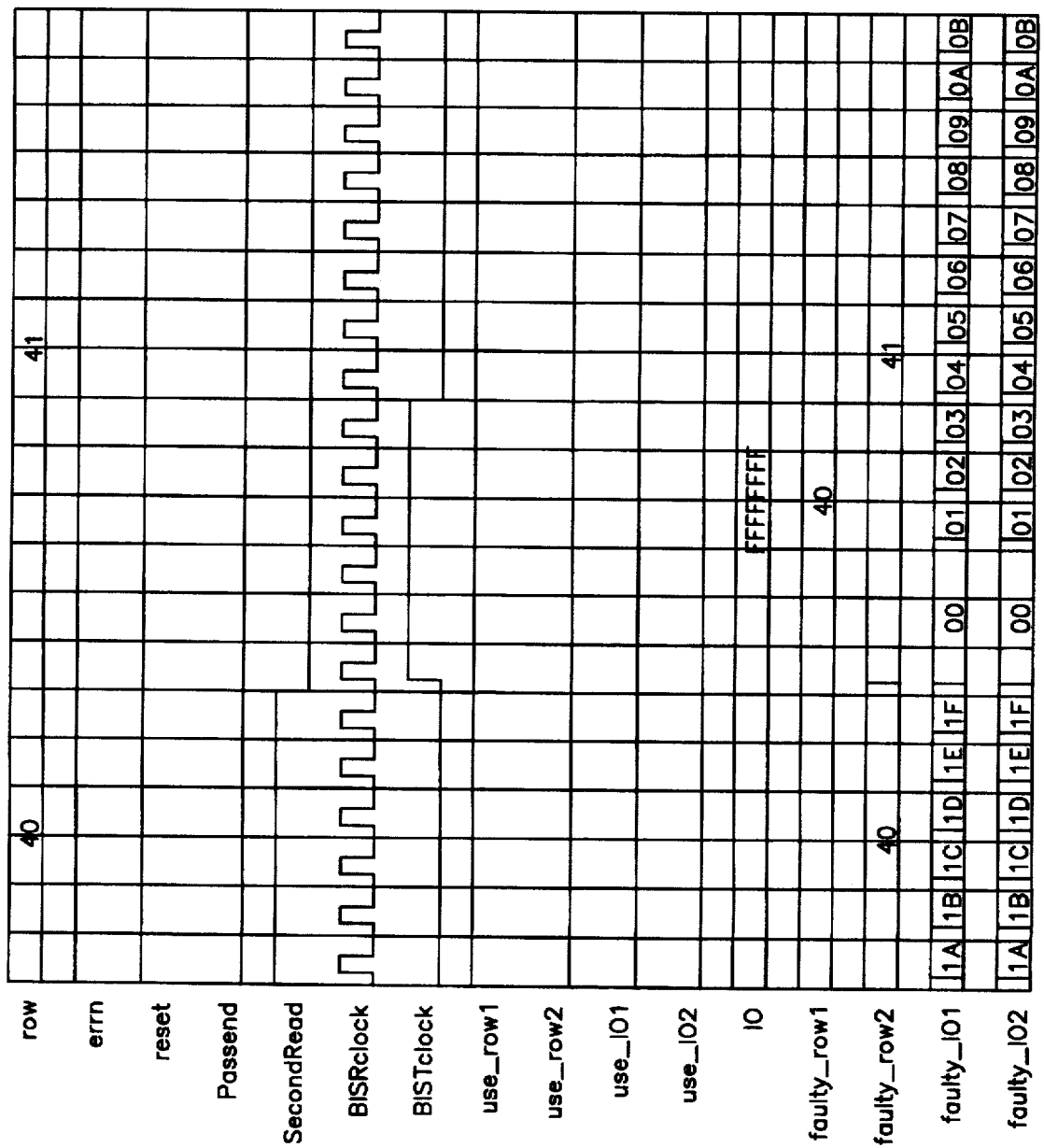
FIGS. 7A–7D are timing diagrams illustrating the operations of the FLARE circuit in accordance with the present invention.
Figure 7B:
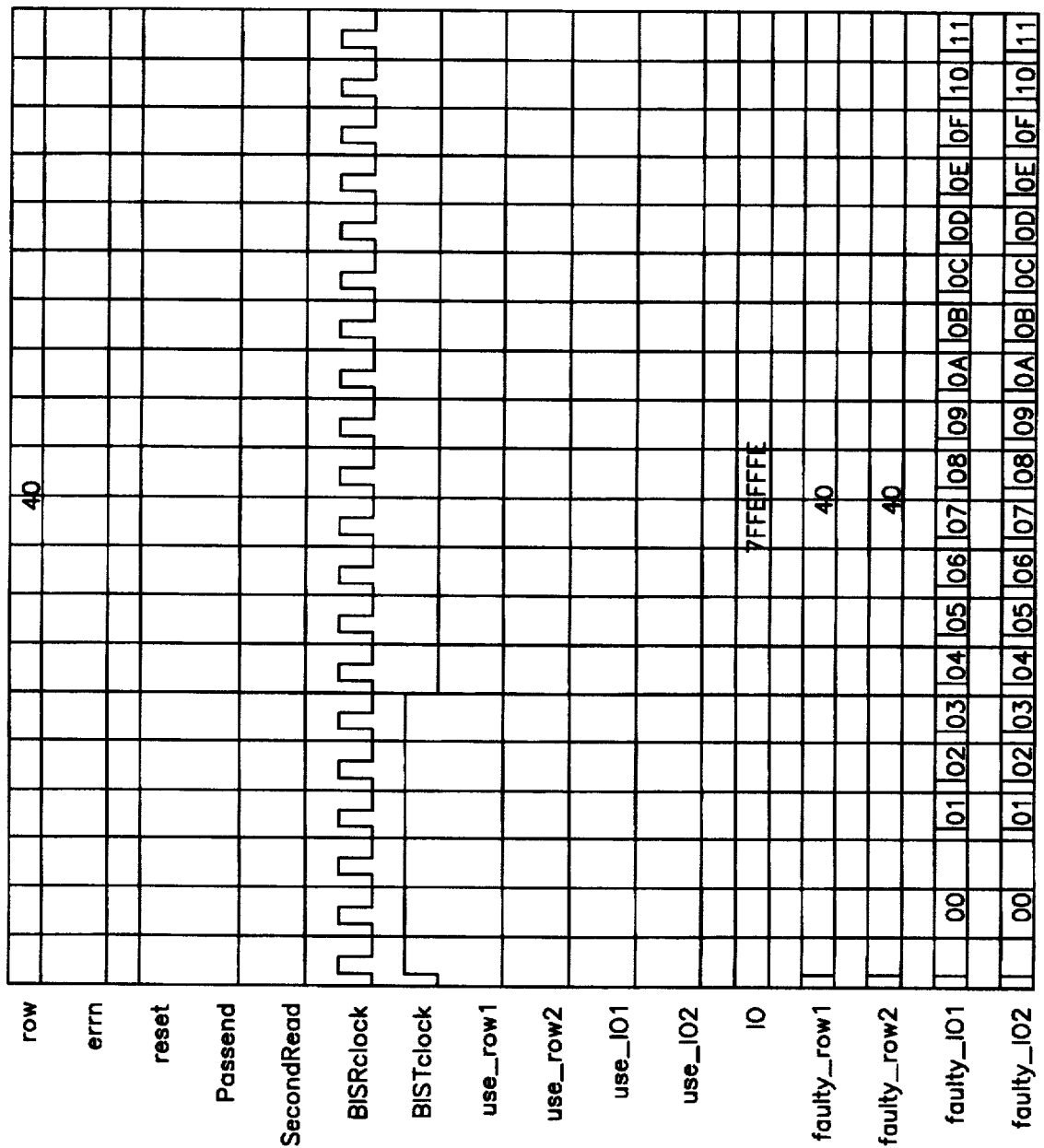
Figure 7C:
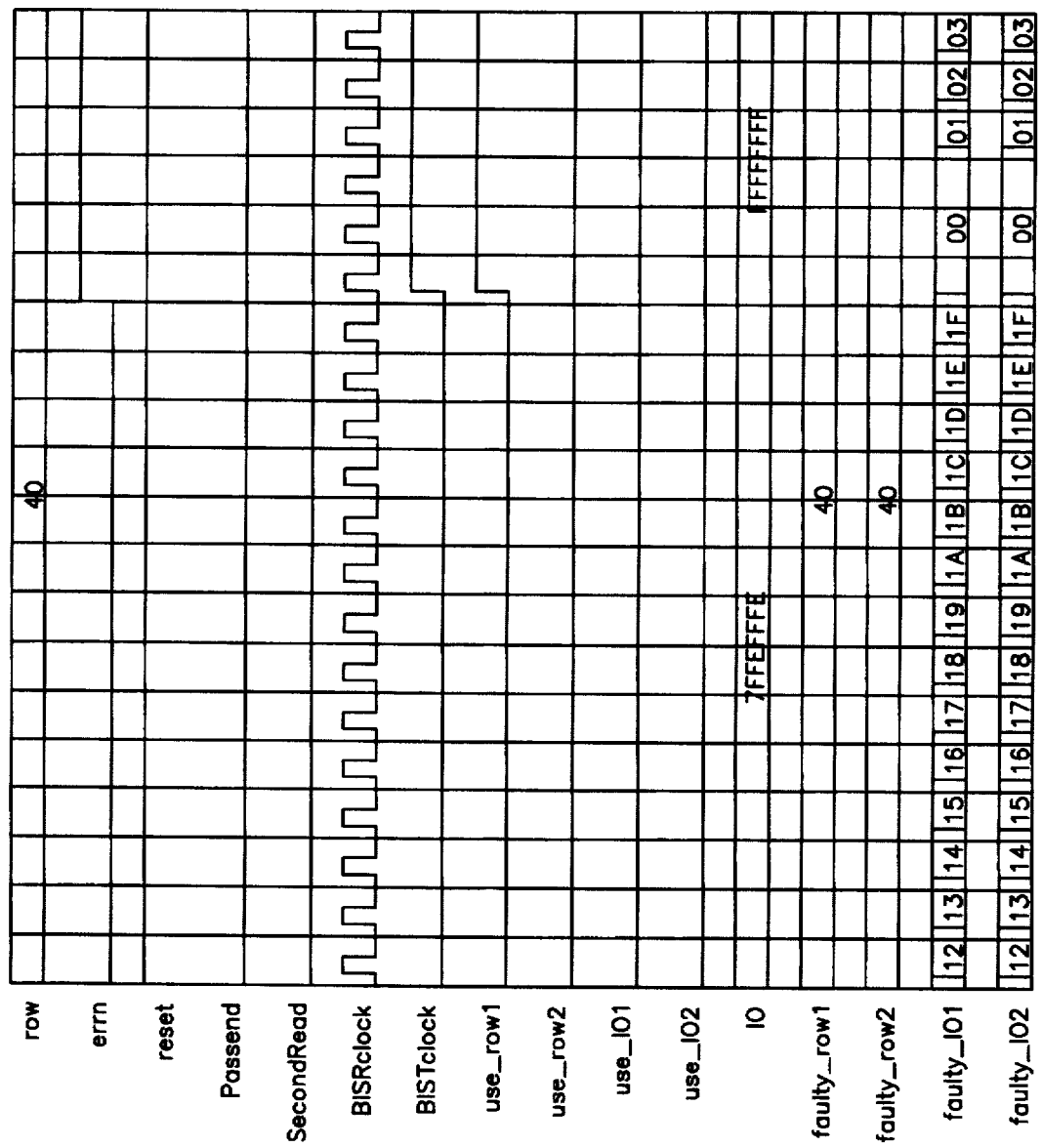
Figure 7D:
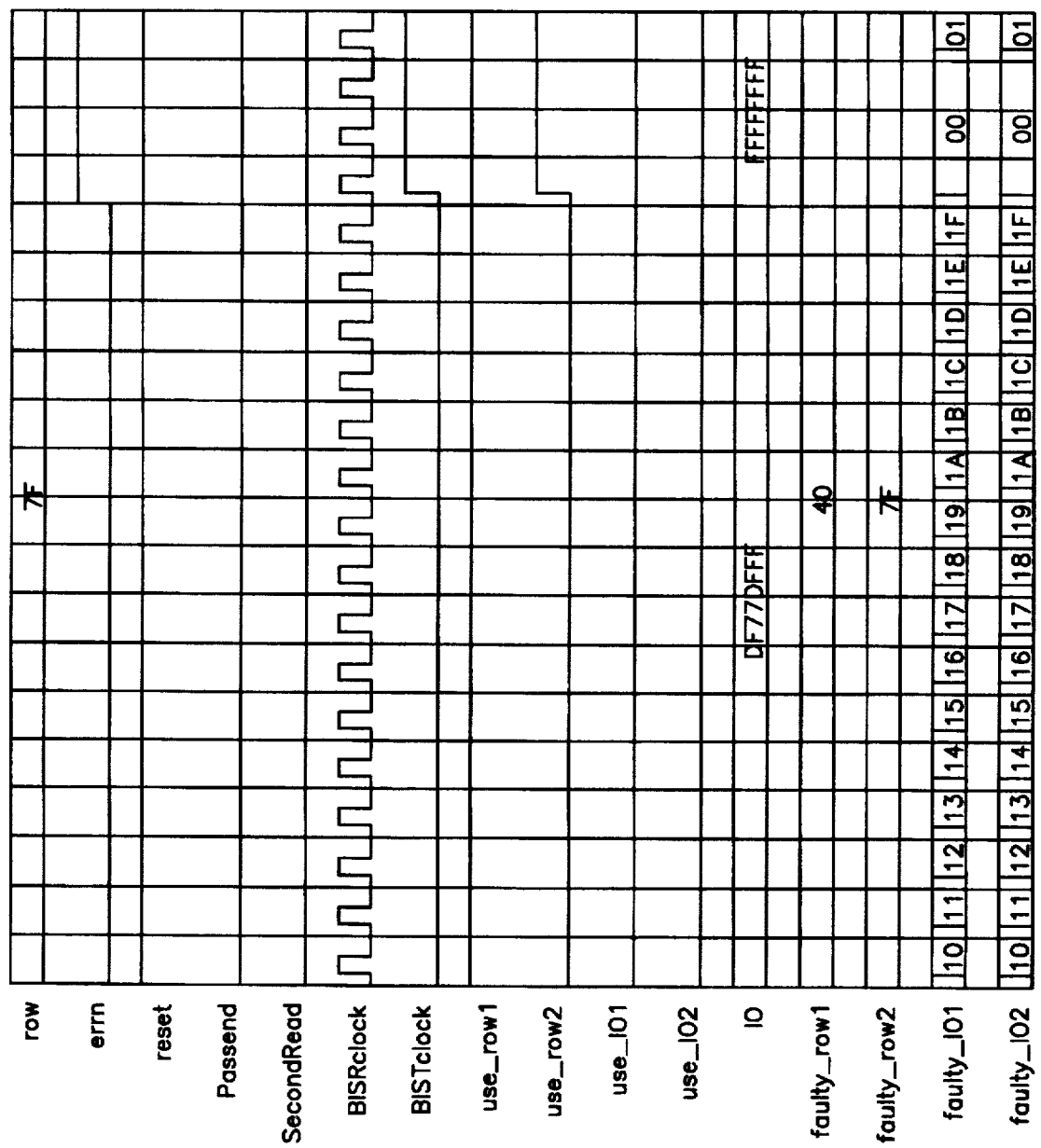

FIGS. 7A–7D are timing diagrams illustrating the operations of FLARE circuit 14. These figures show the occurrence of two mandatory-row repair operations. In each figure, faulty_IO1 and faulty_IO2 signals point to the current IO being analyzed unless the accompanying use_IO1 or use_IO2 signal is asserted indicating that a replacement has occurred. Similarly, faulty_row1 and faulty_row2 signals point to the current row being test unless use_row1 or use_row2 is asserted indicating a replacement has occurred. When use_row1 or use_row2 is asserted, the value of faulty_row1 will be latched. FIG. 7A is a timing diagram illustrating the logic states of various signals when there are no errors detected in memory array 18, as indicated by the IO value FFFFFFFF whose binary representation contains no binary "0s", where a "0" indicates an error at a particular IO location. The error signal indicators, use_row1 and use_row2 are all in the unasserted state, a logic "high" state for error and logic "low" state for use_row1 and use_row2. FIG. 7B illustrates the occurrence of an error as indicated by error being asserted to a "low" logic state and the IO value of 7FFEFFFE. The binary representation of 7FFEFFFE translates to "0111, 1111, 1111, 1110, 1111, 1111, 1111, and 1110", which contains three "0s" indicating three defective cells within the current row. FIG. 7C illustrates that after all IO locations of the current row have been analyzed, the use_row1 signal is asserted and faulty_row1 latches the location of the defective row due to a row-must-repair decision. Similarly, FIG. 7D illustrates a row-must-repair on a different row that has four defective cells as indicated by the IO value DF77DFFF. The signal use_row becomes asserted and faulty_row2 latches the defective row location.

Figure 8:
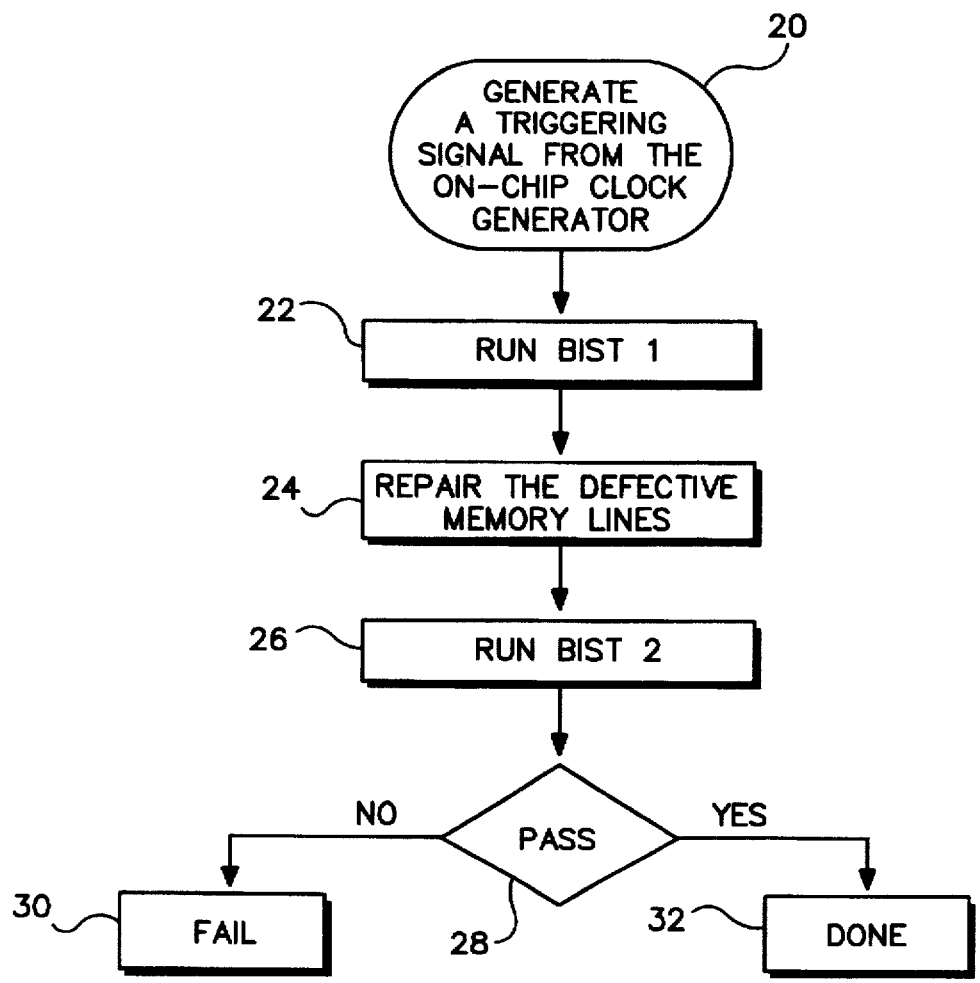
FIG. 8 is a flowgraph of the process of executing FLARE circuit in accordance with the present invention.

FIG. 8 illustrates the process of executing the built-in self-repair system 5 of FIG. 1. At power up of the system 5, on-chip clock generator 10 generates 20 a signal to trigger FLARE circuit 14 to start the repairing process. The repairing process begins with performing 22 a first BIST run through the memory array 18. A BIST run comprises multiple BIST passes. A BIST pass comprises testing and FLARE 14 circuit analysis with necessary repairs of the entire memory array 18 once, by which FLARE 14 circuit analyzes all the row memory lines and I/O memory blocks to generate the address locations of defective memory lines or blocks. A second BIST run is performed 26 to ensure that none of the redundant memory lines themselves are defective, and that memory array 18 does not contain more defective cells than redundant resources available. If no errors are found, then the repairing process is completed 32. However, if additional errors are located in the redundant memory lines, then the memory array 18 remains in the failure state.

Figure 9:
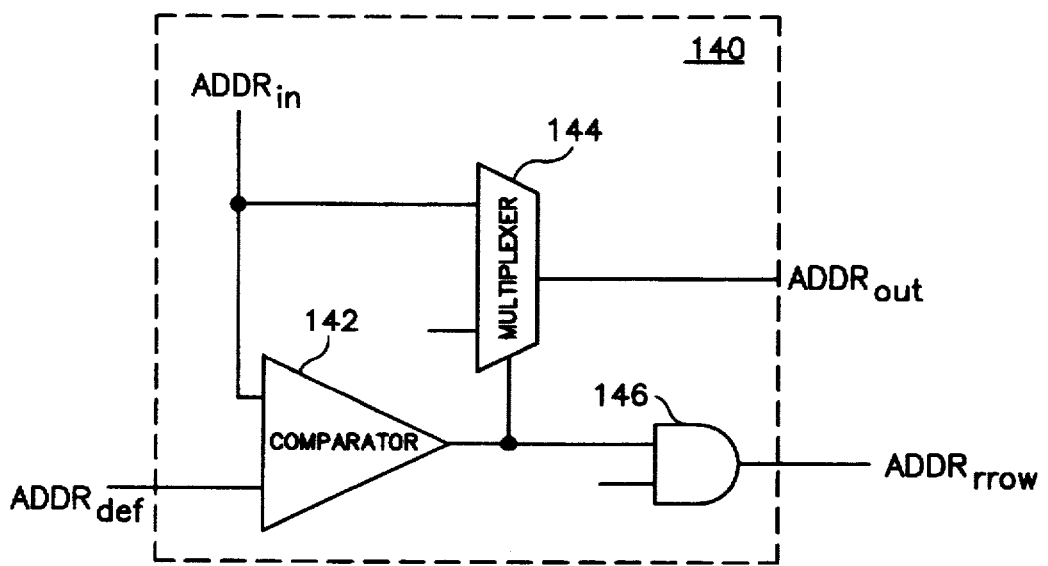
FIG. 9 is a schematic diagram of performing row translation in accordance with the present invention.
Figure 10:
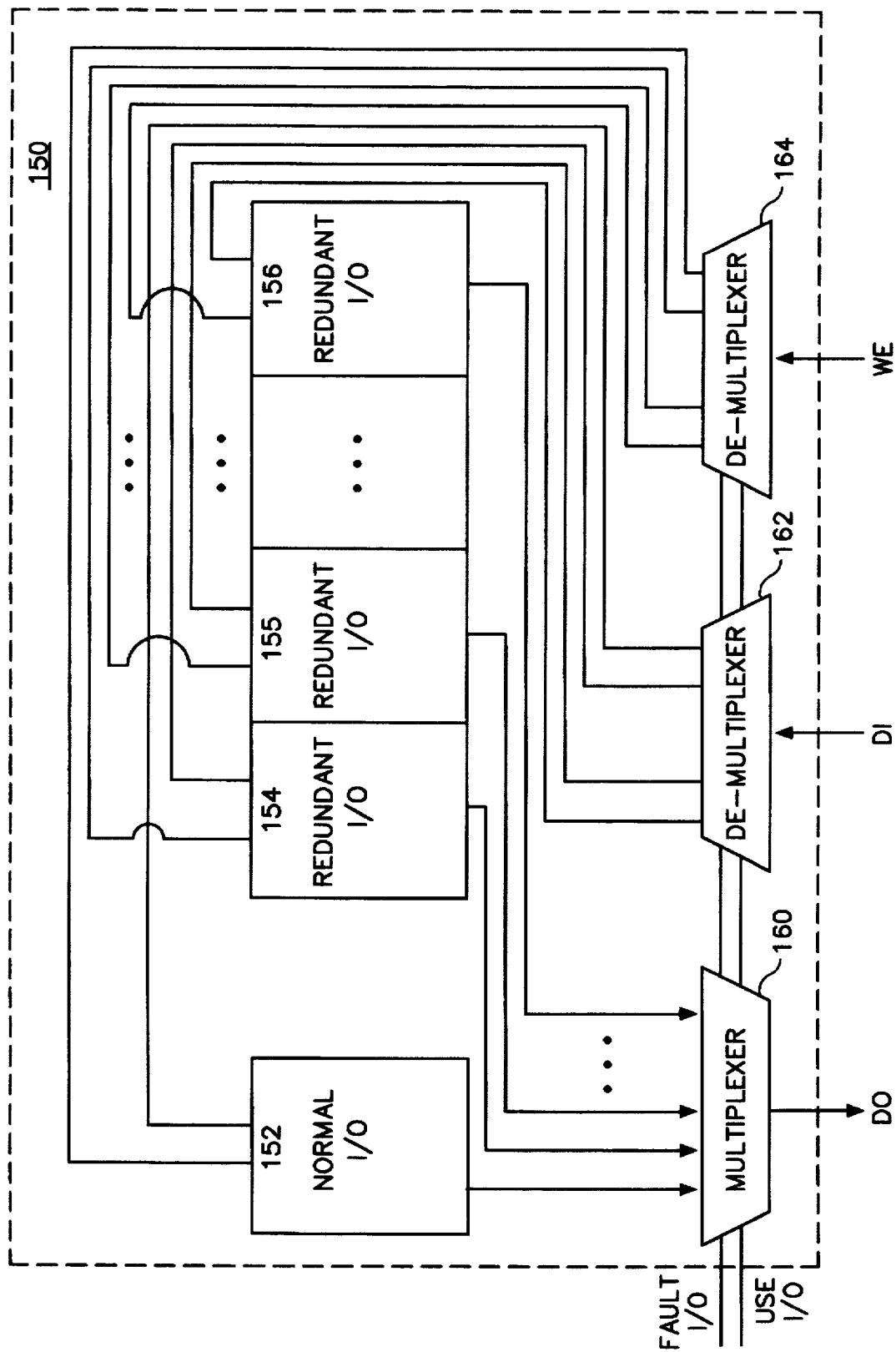
FIG. 10 is a schematic diagram of performing I/O remapping in the remapper circuit in accordance with the present invention.

Referring now to FIG. 9, there is shown a schematic diagram of a row translation circuit 140 that resides in remapper circuit 16. Row translation circuit 140 comprises a comparator 142, a multiplexer 144, and at least one AND gate 146. Comparator 142 receives an input address ADDRin and a defective address ADDRdef to determine if ADDRin matches with ADDRdef. If the contents of ADDRin and ADDRdef match, the multiplexer 144 activates the at least one AND gate 146 to indicate that the redundant row address ADDrow is enabled. Conversely, if the contents of ADDRow and ADDRout are different, then multiplexer 144 selects the ADDRin address as the output address ADDRout, so that the original address is passed through unchanged.

Furthermore, remapper circuit 16 of FIG. 1 includes an I/O remapping circuit 150, for mapping defective I/O memory blocks to redundant I/O memory blocks. I/O remapping circuit 150 includes a multiplexer 160, and de-multiplexers 162 and 164. Multiplexer 160 selects between a normal I/O block 152, redundant I/O blocks 154, 155, and 156 as the signal source to generate the output signal DO. De-multiplexer 162 receives data DI for routing DI to one of the I/O memory blocks 152, 154, 155, and 156. Similarly, de-multiplexer 164 receives the write enable WE signal for routing WE signal to one of the 10 memory blocks 152, 154, 155, and 156. IO remapper circuit 160 is controlled by outputs UseIO and FaultyIO generated by FLARE circuit 14.

We claim:

1. An on-chip self repair system, comprising:
   a memory array for storing data, the memory array including a plurality of row memory lines, and a plurality of I/O memory blocks, a first I/O memory block from the plurality of I/O memory blocks including at least two column lines, the memory array further including a plurality of redundant row memory lines and a plurality of redundant I/O memory blocks, a first redundant I/O memory block corresponding to the first I/O memory block;
   a test circuit, coupled to the memory array, for applying a fault detecting test to the memory array, each detected fault having an address that corresponds to a row memory line and an I/O memory block in the memory array;
   a repair circuit, coupled to the test circuit, for dynamically repairing defective row memory lines with redundant row memory lines and defective I/O memory blocks with redundant I/O memory blocks dependent upon the location of detected faults; whereby the first redundant I/O memory block can be used to repair the first I/O memory block when the test circuit detects a fault in the first I/O memory block; and
   an on-chip clock generator, coupled to the test circuit, for generating a signal to trigger the fault detecting test.

2. The on-chip self repair system of claim 1, further comprising:
   a remapping circuit, coupled to the repair circuit, for remapping the addresses of row lines and I/O memory blocks that have been determined to include defects to redundant row lines and I/O memory blocks.

3. The on-chip self repair system of claim 2, wherein the repair circuit comprises:
   a row repair circuit, for determining whether to repair memory row lines which have been determined to include a defect;
   an I/O repair circuit, for determining whether to repair I/O memory blocks which have been determined to include a defect; and
   an arbitrator, coupled to the row repair circuit and the I/O repair circuit, for implementing a priority scheme used in the determination of whether to repair memory row lines and I/O memory blocks.

4. The on-chip self repair system of claim 3, wherein the fault detecting test used by the testing circuit is a 15N testing algorithm.

5. The on-chip self repair system of claim 3, wherein the priority scheme implemented by the arbitrator is a mandatory I/O memory block repair scheme, whereby the arbitrator determines that the first redundant I/O memory block is used to replace the first I/O memory block when a fault address corresponds to the first I/O memory block and a first memory row line.

6. The on-chip self repair system of claim 3, wherein the priority scheme implemented by the arbitrator is a mandatory memory row line repair scheme, whereby the arbitrator determines that a first redundant memory row line is used to replace a first memory row line when a fault address corresponds to the first I/O memory block and the first memory row line.

7. The on-chip self repair system of claim 3, wherein the on-chip clock generator provides the signal to trigger the repair circuit at system power up, and, subsequent to a first test and repair sequence, a second test is applied by the test circuit to determine whether the repaired memory array includes any faults.

8. An on-chip self repair system, comprising:
   memory array including a plurality of memory row lines, a plurality of I/O memory blocks, a plurality of redundant row memory lines; and a plurality of redundant I/O memory blocks;
   a test circuit, coupled to the memory array, for applying a fault detecting test to the memory array, each detected fault having an address that corresponds to an affected row memory line and an affected I/O memory block in the memory array;
   a repair circuit, coupled to the test circuit, for repairing defective row memory lines with redundant row memory lines and for repairing defective I/O memory blocks with redundant I/O memory blocks, the repair circuit comprising:
      a row repair circuit, for determining whether to repair memory row lines which have been determined to include a defect;
      an I/O repair circuit, for determining whether to repair I/O memory blocks which have been determined to include a defect; and
      an arbitrator, coupled to the row repair circuit and the I/O repair circuit, for implementing a priority scheme for determining whether to repair an affected memory row line or an affected I/O memory block when the address for a detected fault corresponds to both the affected memory row line and the affected I/O memory block; and
   a remapping circuit, coupled to the repair circuit, for remapping the addresses of row lines and I/O memory blocks that have been determined to include defects to redundant row lines and I/O memory blocks.

9. The on-chip self repair system of claim 8, further comprising:
   an on-chip clock generator, coupled to the test circuit, for producing a signal that triggers the fault detecting test upon system power up.

10. The on-chip self repair system of claim 9, wherein the fault detecting test is repeated after the memory array is repaired in order to verify the integrity of the repair.

11. The on-chip self repair system of claim 8, wherein the remapping circuit comprises a row translation circuit comprising:
   a comparator, for determining whether an input address matches a defective address; and
   logical circuitry, coupled to the comparator and the memory array, for outputting a redundant address for the defective address when the input address matches the defective address, and for outputting the input address when the input address does not match the defective address.

12. For use with an on-chip self repair system including a memory array with a plurality of memory row lines, a plurality of I/O memory blocks, a plurality of redundant row memory lines, and a plurality of redundant I/O memory blocks, a method of repairing the memory array using redundant circuitry, the method comprising the steps of:

using an on-chip clock generator to produce a signal that triggers a fault detecting test upon system power up;

applying a fault detecting test to the memory array, each detected fault having an address that corresponds to an affected row memory line and an affected I/O memory block in the memory array; and replacing defective row memory lines with redundant row memory lines and replacing defective I/O memory blocks with redundant I/O memory blocks using a priority scheme that determines whether to repair an affected memory row line or an affected I/O memory block when the address for a detected fault corresponds to both the affected memory row line and the affected I/O memory block; and remapping the addresses of row lines and I/O memory blocks that have been determined to include defects to the redundant row lines and I/O memory blocks.

13. The method of claim 12, further comprising:

after the replacing step, applying the fault detecting test again to determine the integrity of the replacement.

* * * * *